(12) United States Patent
Voss

(10) Patent No.: US 9,041,460 B2
(45) Date of Patent: May 26, 2015

(54) PACKAGED POWER TRANSISTORS AND POWER PACKAGES

(71) Applicant: Infineon Technologies AG, Neubiberg (DE)

(72) Inventor: Ingo Voss, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/964,271

(22) Filed: Aug. 12, 2013

(65) Prior Publication Data

US 2015/0042384 A1   Feb. 12, 2015

(51) Int. Cl.
*H01L 25/00* (2006.01)
*H01L 27/02* (2006.01)
*H01L 23/00* (2006.01)

(52) U.S. Cl.
CPC ............ *H01L 27/0207* (2013.01); *H01L 24/80* (2013.01)

(58) Field of Classification Search
USPC ........... 257/203, 206, 723, 724; 327/564–566
See application file for complete search history.

(56) References Cited

U.S. PATENT DOCUMENTS

| | | | |
|---|---|---|---|
| 4,722,441 A | 2/1988 | Arai et al. | |
| 5,814,884 A * | 9/1998 | Davis et al. | 257/723 |
| 6,055,148 A | 4/2000 | Grover | |
| 6,448,643 B2 * | 9/2002 | Cheah et al. | 257/723 |
| 7,786,604 B2 * | 8/2010 | Tai | 257/784 |
| 8,441,278 B2 * | 5/2013 | Yamanishi et al. | 324/762.01 |
| 2010/0289127 A1 | 11/2010 | Kanazawa et al. | |

FOREIGN PATENT DOCUMENTS

| | | |
|---|---|---|
| DE | 19615112 | 10/1997 |
| GB | 1180368 | 2/1970 |
| GB | 2274738 | 8/1994 |
| JP | S6155946 | 3/1986 |
| JP | H02138766 | 5/1990 |
| JP | H099644 | 1/1997 |
| JP | H09213960 | 8/1997 |
| JP | H10189870 | 7/1998 |
| JP | 2930074 | 8/1999 |
| JP | 2009239299 | 10/2009 |
| WO | 2009033891 | 3/2009 |

* cited by examiner

*Primary Examiner* — An Luu

(57) ABSTRACT

A power package is provided comprising a packaged transistor and a driving unit connected to the transistor and adapted to drive the transistor. A control terminal of the transistor is connected to a middle terminal pin of the housing of the transistor and outer terminal pins of the housing are connected to the driving unit and to a voltage level, respectively, wherein the connections are crossing free.

12 Claims, 2 Drawing Sheets

PACKAGED POWER TRANSISTORS AND POWER PACKAGES

BACKGROUND OF THE INVENTION

1. Field of the Invention

The present invention relates to packaged power transistors and power packages or modules.

2. Description of the Related Art

In the art a plurality of electronic arrangements or systems relating to so called power packages, e.g. DC/DC converter or battery charger, are known. These power arrangements often comprise topologies comprising a so called H-bridge configuration comprising two half-bridges. In some instances the electronic arrangements comprises a plurality of half-bridges arranged parallel connected to each other (i.e. a parallel configuration) wherein the half-bridges may be controlled in such a way that the different half-bridges provide power signals having different phases or are out of phase in order to reduce ripples of a resulting power signal.

An example of such an H-bridge configuration of transistors is shown in FIG. 3. In particular, FIG. 3 shows an H-bridge arrangement 300 comprising four transistors, e.g. bipolar transistors, 301, 302, 303, and 304 each comprising two controlled terminals 305 and 306, respectively, and one control terminal 318. Such a configuration is often used as a switching power supply or as a DC/DC converter in the automotive technology. One of the controlled terminal 305 of the first and second transistors 301 and 302 is connected to a first voltage level of a voltage source 307 while the other one of the controlled terminals 306 is connected to a first node 308 and second node 309, respectively. A first controlled terminal 306 of the third transistor 303 is connected as well to the first node 308 while a first controlled terminal 306 of the fourth transistor 304 is connected to the second node 309. The second controlled terminals 306 are connected to a second voltage level of the voltage source 307. The first node 308 and the second node 309 are connected to a primary part of a transformer 310 while outer terminals of the secondary part of the transformer 310 are connected via diodes 311 and 312 to a corresponding third node 313. A middle terminal of the secondary part of the transformer 310 is connected to a first voltage output terminal 314. The third node is connected to a second voltage output terminal 315 via a filter circuit comprising an inductor 316 connected in series and a capacitor 317 connected in parallel.

Additionally, each of the four transistors comprises a diode 319 connected between the two controlled terminals 305 and 306 of each transistor and functioning as a protection for the four transistors.

A typical power level of such transformers is in the order of 3.5 kW while the switching frequency is in the range of 100 kHz and the voltage level is in the order of a couple of hundreds volts.

FIG. 4 depicts a schematic circuit diagram of a power package 400 comprising a first transistor 401, a second transistor 402, a third transistor 403 and a fourth transistor 404. The transistors are field-effect transistors and each comprising a source terminal S and a drain terminal D and a gate terminal G. Furthermore, the power package 400 comprises a first driving unit 405, a second driving unit 406, a third driving unit 407 and a fourth driving unit 408. Each of the fourth transistors 401 to 404 is connected to a respective one of the driving units 405 to 408. In particular, the source terminals of each of the four transistors are connected to a respective driving unit and the gate terminals of each of the four transistors are connected to the respective driving unit. Additionally the drain terminals of the first transistor 401 and the third transistor 403 are connected to a first voltage level 409 and the drain terminals of the second and of the fourth transistor are connected to the source terminals of the first transistor and the third transistor, respectively. Furthermore, the source terminals of the second transistor 402 and of the fourth transistor 404 are connected to a second voltage level 410.

While providing a working power package there may still be room for improvements.

SUMMARY OF THE INVENTION

Thus, there still may be a need to provide power packages showing a high performance and having a simple layout.

According to an exemplary aspect a power package is provided, wherein the power package comprises a housing comprising a first outer terminal pin, a second outer terminal pin and a middle terminal pin arranged between the first outer terminal pin and the second outer terminal pin; a transistor comprising a first controlled terminal, a second controlled terminal, and a control terminal and housed in the at least one housing, wherein the control terminal of the at least one transistor is connected to the middle terminal pin; and a driving unit comprising a first interface pin and a second interface pin, wherein the first interface pin is connected to the first outer terminal pin of the housing and the second interface pin is connected to the middle terminal pin of the housing, wherein the first controlled terminal of the transistor is connected to the first outer terminal pin and the second controlled terminal of the transistor is connected to the second outer terminal pin, wherein the first outer terminal pin is connected to the first interface pin by a first connection, wherein the middle terminal pin is connected to the second interface pin by a second connection, and the second outer terminal pin is connected to a voltage level by a third connection, and wherein the first connection and the third connection do not cross each other.

According to an exemplary aspect a voltage controlled power transistor package is provided, wherein the packaged voltage controlled power transistor comprises a housing comprising two outer terminal pins and one middle terminal pin arranged between the two outer terminal pins; a voltage controlled transistor comprising two controlled terminals and one control terminal and being packaged in the housing, wherein the two controlled terminals are connected to the outer terminal pins and the control terminal is connected to the middle terminal pin.

According to an exemplary aspect a method of manufacturing a power package is provided, wherein the method comprises providing a transistor comprising a first controlled terminal, a second controlled terminal and a control terminal; housing the transistor in a housing comprising a first outer terminal pin, a second outer terminal pin and a middle terminal pin, wherein the control terminal is connected to the middle terminal pin and the first controlled terminal and the second controlled terminal are connected to the first outer terminal pin and the second outer terminal pin, respectively; connecting the first outer terminal pin to a driving unit by a first connection line and the middle terminal pin to the driving unit by a second connection line; connecting the second outer terminal pin to a voltage level by a third connection, wherein the first connection and the third connection do not cross each other.

By providing a packaged or housed transistor comprising a middle terminal pin connected to the control terminal of the housed transistor it may be possible to provide an electronic arrangement e.g. a power package wherein the layout may be simplified. For example, a power package comprising a control terminal pin arranged as a middle terminal pin may enable a layout comprising less or even no crossings of connections between the housed transistors and a driving unit or driver of the power package. In particular, the reduction or even avoiding of crossings of connection may even be possible in case of so called H-bridge arrangement or half-bridge arrangements often used in power packages.

Due to the layout or placing of the transistors or switching elements of exemplary embodiments it may be possible to arrange components, e.g. the transistors and their corresponding connection paths symmetrically on circuit boards. Furthermore, it may be possible to arrange the transistors (and optionally driver units) closer to each other, so that controlling may be simplified and dynamic losses may be reduced due to shorter connection lines. Additionally, the shorter connection lines may as well reduce electromagnetic losses, interference liability and emission of electromagnetic waves. By allowing for closer placing of the electronic elements, e.g. transistors, an increased power density may be allowed as well.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DESCRIPTION OF FURTHER EXEMPLARY EMBODIMENTS

Figure 1:
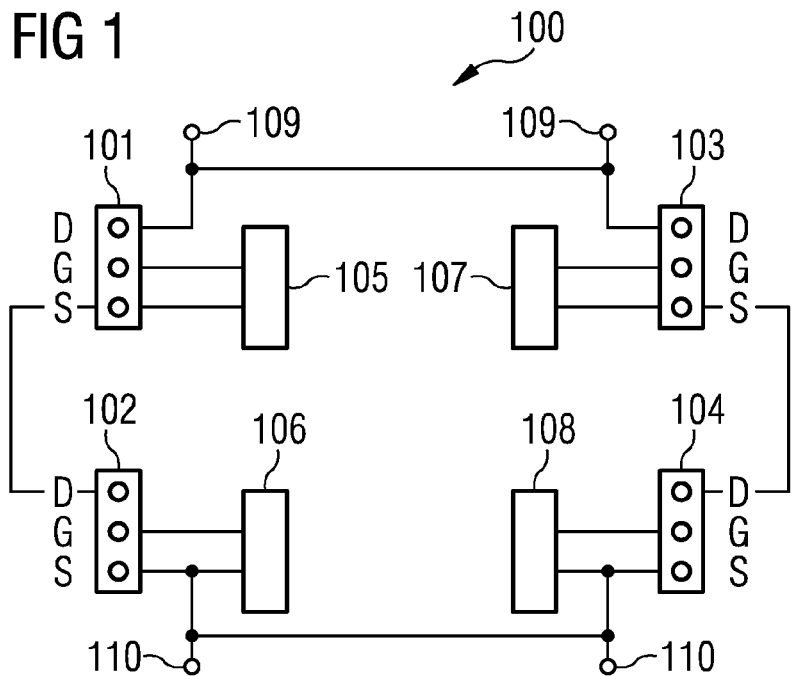
FIG. 1 shows a schematic circuit diagram of a power package according to an exemplary embodiment.

In the following, further exemplary embodiments of the power package will be explained. It should be noted that embodiments described in the context of the power package or power module may also be combined with embodiments of the method of manufacturing a power package and vice versa.

According to an exemplary aspect a power package is provided which comprises a first driving unit comprising a first interface terminal and a second interface terminal; a second driving unit comprising a first interface terminal and a second interface terminal; a first electronic switching element comprising a first switch terminal and a second switch terminal; a second electronic switching element comprising a first switch terminal and a second switch terminal, wherein the first switch terminal of the first electronic switching element is connected to the first interface terminal of the first driving element by a first connection line, and wherein the second switch terminal of the first electronic switching element is connected to the second interface terminal of the first driving element by a second connection line, wherein the first switch terminal of the second electronic switching element is connected to the first interface terminal of the second driving element by a third connection line, and wherein the second switch terminal of the second electronic switching element is connected to the second interface terminal of the second driving element by a fourth connection line, and wherein the first connection line, the second connection line, the third connection line and the fourth connection line, do not cross each other.

In particular, the electronic switching element may be a diode or a transistor. In case the switching element is formed by a diode, one switch terminal may be formed by a cathode of the diode and the other switch terminal may be formed by an anode of the diode.

In particular, the power package may be arranged on a circuit board, e.g. a printed circuit board or a leadframe. In particular, the housed or packaged transistors may be power transistors, i.e. adapted to withstand a high voltage (several hundreds of volts, e.g. in the range of 100 volts to 1000 volts, in particular about 300 to 700 volts) and/or a high power (several hundreds of watts, e.g. in the range of 200 watts to 5,000 watts, in particular in the range of 500 watts to 3,500 watts) and/or a high switching frequency (up to the range of 50 kHz to 1,000 kHz). In particular, the first connection may not cross the second connection and the third connection and the second connection may not cross the third connection. In other words the connections may be cross-free or intersection-free. In particular, the connections or connection lines may be arranged on a same level or in one plane and the connections or connection lines may be cross-free with respect to each other in a view perpendicular to the plane. For example, the connections or connection lines may be electrically conductive connections. In particular, the driving unit or driver may drive the transistor(s) of the power package.

The phrase "do not cross each other" or "cross-free" may particular denote that two connections, e.g. signal or power connection lines, are intersection-free with respect to each other. In another wording it may be said that one of the two connections is conducted through a first area of the power package, e.g. on a circuit board, while the other one of the two connections is conducted through a second area of the power package and the first and second areas are distinct or separate from each other. In other words the term "do not cross" or "cross-free" may particularly denote that the respective lines or connection paths are connected to interfaces without crossing each other. The respective connection lines or connection paths may be arranged in different distinct sections or areas.

In particular, the power package may be a multi-stage power arrangement, i.e. a power arrangement comprising a plurality of switching elements, e.g. transistors or diodes, arranged in parallel to each other.

The term "power package" may particular denote an arrangement comprising packaged components. However, it is not necessary (but possible) that the arrangement itself is packaged. Thus, the term power package may denote an arrangement, e.g. a DC/DC converter or a switching power supply, attached to a board, e.g. a printed circuit board and comprising packaged or housed power transistors and driving units which may be packaged or not but wherein the arrangement itself is not packaged.

In particular, the voltage level(s) may form or may define the supply voltage used to operate the power package.

The term "control terminal" may particularly denote the terminal of a transistor which is controlling or switching the transistor, e.g. may be formed by the gate terminal of a field effect transistor, the gate terminal of an insulated gate bipolar transistor (IGBT) or the base in case of a bipolar transistor.

According to an exemplary embodiment the power package further comprises a second housing comprising a first outer terminal pin, a second outer terminal pin and a middle terminal pin arranged between the first and second outer terminal pins; a second transistor comprising a first controlled terminal, a second controlled terminal, and a control terminal and housed in the at least one housing, wherein the control terminal of the second transistor is connected to the middle terminal pin of the second housing; and a second driving unit comprising a first interface pin and a second interface pin, wherein the first interface pin of the second driving unit is connected to the first outer terminal pin of the second housing and the second interface pin of the second driving unit is connected to the middle terminal pin of the second housing; wherein the first controlled terminal of the second transistor is connected to the first outer terminal pin of the second housing and the second controlled terminal of the second transistor is connected to the second outer terminal pin of the second housing, wherein the first outer terminal pin of the housing is connected to the first interface pin of the second driving unit by a fourth connection, wherein the middle terminal pin of the second housing is connected to the second interface pin of the second driving unit by a fifth connection, and the second outer terminal pin of the second housing is connected to a further voltage level by a sixth connection, and wherein the fourth connection and the sixth connection do not cross each other.

In particular, the fourth connection may not cross or intersect the first connection, the second connection, the third connection, the fifth connection and the sixth connection. The sixth connection may not cross or intersect the first connection, the second connection, the third connection, the fourth connection and the fifth connection. In particular, the connections or connection lines may be cross-free or intersection-free.

According to an exemplary embodiment of the power package the power package forms a half-bridge arrangement.

The term "half-bridge" may particularly denote single direction configuration of a so called "H-bridge" which is in turn an electronic circuit that enables a voltage to be applied across a load in either direction.

According to an exemplary embodiment of the power package the power package further comprises a second half-bridge arrangement forming together with the first half-bridge arrangement an H-bridge arrangement.

According to an exemplary embodiment the power package further comprises a plurality of half-bridge arrangements wherein at least two of the plurality of half-bridge arrangements are connected in parallel to each other.

In particular, phases of switching, controlling or driving signals of the half-bridge arrangements connected in parallel to each other may be different. Thus, it may be possible to provide a multi-phase arrangement enabling that ripples may be reduced resulting from switching of the half-bridge arrangements.

According to an exemplary embodiment the power package further comprises a control unit which is connected to the driving unit and operable to control the driving unit.

In particular, the control unit may be a microcontroller. For example, the driving unit and the second driving unit may both be connected to the same control unit. In particular, the control unit may be operable to control the driving unit and/or the second driving unit.

According to an exemplary embodiment of the power package the control unit comprising a first controlling terminal arranged on a first lateral side of the control unit and second controlling terminal arranged on a second lateral side of the control unit.

In particular, the first lateral side and the second lateral side may be opposite sides of the control unit(s). In some embodiments, the first controlling terminal and/or the second controlling terminal may be formed by a set of controlling sub-terminals.

According to an exemplary embodiment the power package further comprises a first diode and a second diode, wherein the first diode is connected between the first controlled terminal and the second controlled terminal of the transistor and the second diode is connected between the first controlled terminal and the second controlled terminal of the second transistor.

The diodes may particularly useful for providing an over voltage protection for the transistors.

According to an exemplary embodiment of the power package the housed transistor is selected from the group consisting of a field effect transistor, and a bipolar transistor.

In particular, the transistors may be metal-oxide-semiconductor field-effect transistors (MOSFET), e.g. so called power MOSFETs, or insulated gate bipolar transistors (IGBTs).

In particular, in the case of a FET the sequence of the terminal pins of the first housing may be drain-gate-source while the second housing may have the sequence of source-gate-drain, when looking onto the side of the packaged power transistor where the terminal pins are arranged and having a backside of the packaged power transistor arranged on the bottom side. In case of a bipolar transistor the sequence of the terminal pins of the first housing may be collector-base-emitter while the second housing may have the sequence of emitter-base-collector when looking at the housings arranged in the same orientation.

In an illustrative way it may be said that the first housing and the second housing are mirrored with respect to each other. However, not only the housings may be mirrored but of course also the transistors arranged in the housing may be mirrored with respect to its controlled terminals.

By providing a power package comprising two mirrored housings wherein the control terminal of each transistor arranged in the housings is connected to the middle terminal pin it may be possible to avoid any crossings of connection lines between the housings and driving units connected to the housings. That is, it may be possible to disentangle connection lines of a power package.

According to an exemplary embodiment of the power package further comprises the driving unit and the second driving unit comprise a different sequence of the interface pins.

That is, the first driving unit and the second driving unit may be mirrored with respect to each other when considering the interface pins and/or internal set-up or layout.

According to an exemplary embodiment of the power package the first connection is conducted through a first area of the power package and the third connection is conducted through a second area of the power package and the first and second areas are distinct from each other.

According to an exemplary embodiment of the voltage controlled power transistor package the transistor is a field effect transistor and the control terminal of the transistor is a gate terminal.

In particular, the field effect transistor may be a MOSFET, e.g. a power MOSFET.

According to an exemplary embodiment of the voltage controlled power transistor package the transistor is an insulated gate bipolar transistor and the control terminal of the transistor is a gate terminal.

Summarizing a gist of an exemplary embodiment may be seen in providing a power package or packaged power module comprising a packaged transistor and a driving unit connected to the transistor and adapted to drive the transistor. A control terminal of the transistor is connected to a middle terminal pin of the housing of the transistor and outer terminal pins of the housing are connected to the driving unit and to a voltage level, respectively, wherein the connections are crossing free or cross-free. The disclosure of using mirrored devices, e.g. transistors, or driving units, for the forming of power packages may be used in several different power arrangements, e.g. in power packages comprising power MOSFETs, comprising IGBTs or diodes, or power packages comprising half-bridge, H-bridge, multi-phase configurations or parallel configuration comprising the before mentioned power packages. Furthermore, the disclosure may also be suitable to provide mirrored driving units and or control units comprising controlling terminals on two sides of the control unit thus enabling a layout of the power packages having a low complexity and/or reduced number of crossings of connection lines.

In exemplary embodiments a plurality of transistors or switching elements may be part of the power package and a respective plurality of driving units may be provided as well to which the plurality of transistors are connected. The plurality of transistors and/or driving units may be dividable into two groups wherein the layout of the members of the one group may be mirrored in respect to the layout of the members of the other group. Due to the mirroring it may be possible to reduce or avoid crossings or intersections of connection lines connecting each transistor with the respective one of the driving units and/or voltage levels.

DETAILED DESCRIPTION OF THE FIGURES

The above and other objects, features and advantages of the present invention will become apparent from the following description and the appended claims, taken in conjunction with the accompanying drawings, in which like parts or elements are denoted by like reference numbers.

The illustration in the drawing is schematically and not necessarily to scale.

FIG. 1 shows a schematic circuit diagram of a power package 100 according to an exemplary embodiment comprising a first transistor 101, a second transistor 102, a third transistor 103 and a fourth transistor 104. The transistors are field-effect transistors and each comprising a source terminal S and a drain terminal D and a gate terminal G. As can be seen in FIG. 1 the gate terminal is arranged between the source and the drain terminals in each of the transistors 101 to 104. Furthermore, the power package 100 comprises a first driving unit 105, a second driving unit 106, a third driving unit 107 and a fourth driving unit 108. Each of the fourth transistors 101 to 104 is connected to a respective one of the driving units 105 to 108.

In particular, the source terminals of each of the four transistors are connected to a respective driving unit and the gate terminals of each of the four transistors are connected to the respective driving unit. Additionally the drain terminals of the first transistor 101 and the third transistor 103 are connected to a first voltage level 109 and the drain terminals of the second and of the fourth transistor are connected to the source terminals of the first transistor and the third transistor, respectively.

Furthermore, the source terminals of the second transistor 102 and of the fourth transistor 104 are connected to a second voltage level 110.

As can be seen in FIG. 1 the sequence of the controlled/control terminals of the transistors is different for the first/third transistor and the second/fourth transistor. While the sequence at the first transistor 101 and the second transistor 102 is S-G-D the sequence at the third transistor 103 and fourth transistor 104 is D-G-S when looked onto the transistors from the same side.

Since two different housed transistors are provided comprising a different sequence of terminal pins, while the gate terminal is arranged in the middle it is possible to connect each of the transistors to a respective driving unit by connection lines while avoiding crossing of the connection lines. Thus, the circuit layout may be less complex, leading to a less complex circuit board layout, since crossing of the connection lines may be reduced to a minimum. This may also reduce the time needed for manufacturing the circuit board. Additionally such a layout may allow for controlling symmetric arrangements or modules in an optimal way.

Figure 2:
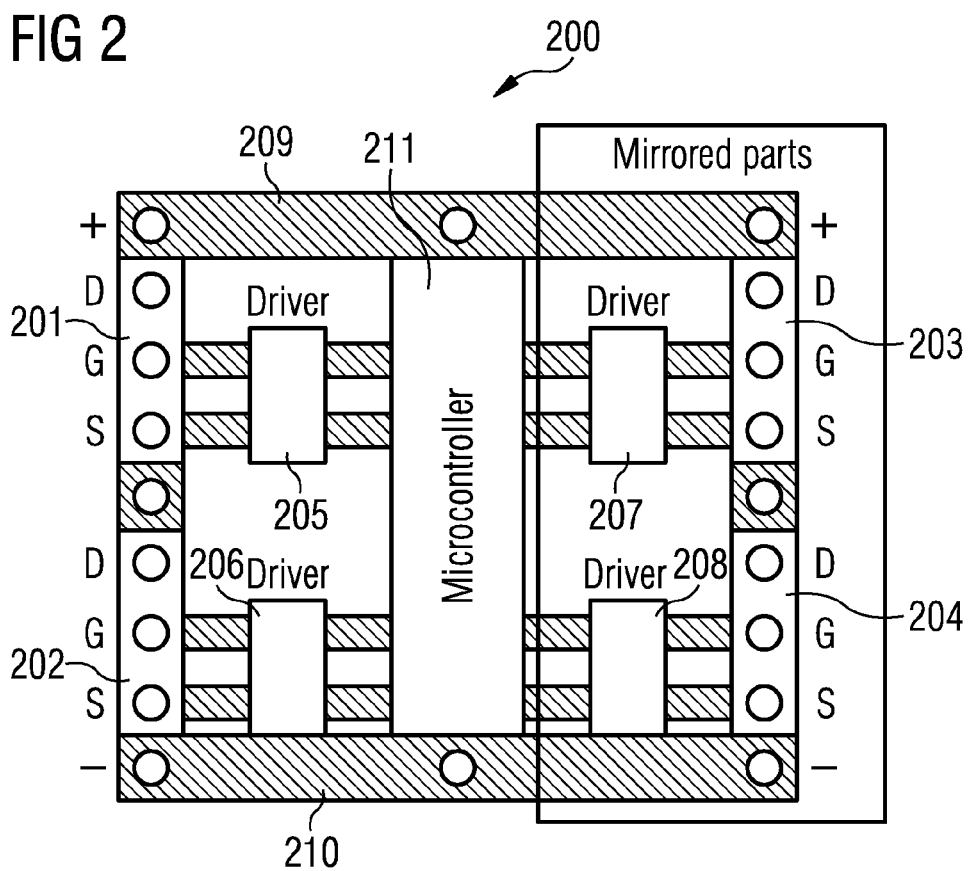
FIG. 2 shows a schematic block diagram of a power package according to an exemplary embodiment.
Figure 3:
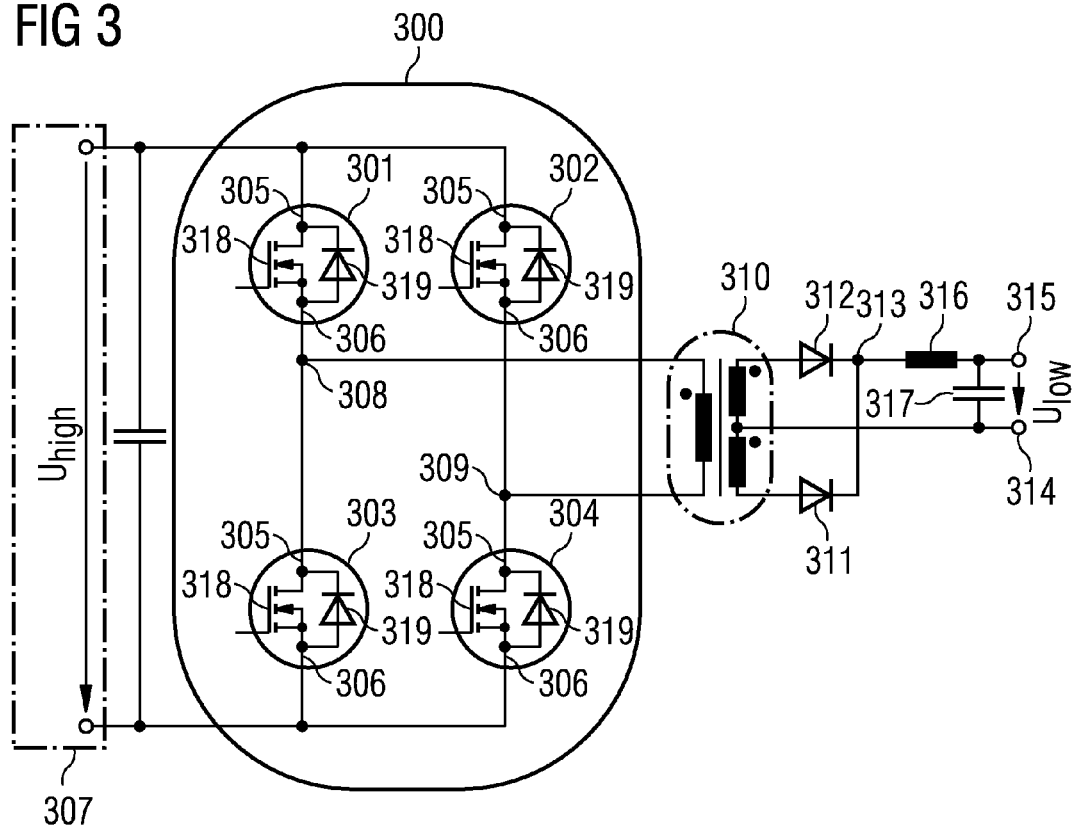
FIG. 3 shows a circuit diagram of a common power package.
Figure 4:
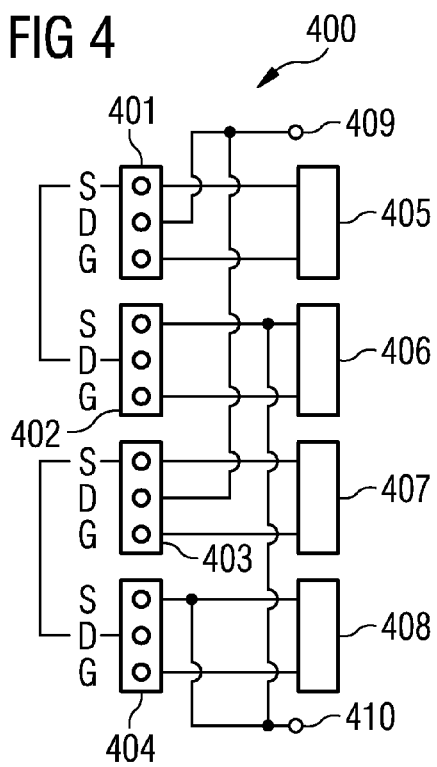
FIG. 4 shows a schematic circuit diagram of a common power package.

FIG. 2 shows a schematic block diagram of a power package 200 according to an exemplary embodiment. In particular, the power package 200 comprises first transistor 201, a second transistor 202, a third transistor 203 and a fourth transistor 204. The transistors are field-effect transistors and each comprising a source terminal S and a drain terminal D and a gate terminal G. As can be seen in FIG. 2 the gate terminal is arranged between the source and the drain terminals in each of the transistors 201 to 204. Furthermore, the power package 200 comprises a first driving unit 205, a second driving unit 206, a third driving unit 207 and a fourth driving unit 208. Each of the fourth transistors 201 to 204 is connected to a respective one of the driving units 205 to 208.

Additionally the drain terminals of the first transistor 201 and the third transistor 203 are connected to a first voltage level 209 (high level, +) and the drain terminals of the second transistor 202 and of the fourth transistor 204 are connected to the source terminals of the first transistor and the third transistor, respectively.

Furthermore, the source terminals of the second transistor 202 and of the fourth transistor 204 are connected to a second voltage level 210 (low voltage, ground).

In addition, the power package 200 comprises a microcontroller 211 which is connected to all four driving units 205 to 208 and may be used to control the driving units and thus the transistors.

As can be seen in FIG. 2 the used layout and in particular the provision of two types or versions of driving units and transistors enables a general layout of the power package which has a low complexity and no crossings or intersections of connections. For clarity reasons electrically conducting connections are depicted in FIG. 2 as hatched areas 212.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A power package comprising:
    a housing comprising a first outer terminal pin, a second outer terminal pin and a middle terminal pin arranged between the first outer terminal pin and the second outer terminal pin;
    a transistor comprising a first controlled terminal, a second controlled terminal, and a control terminal and housed in the housing, wherein the control terminal of the transistor is connected to the middle terminal pin; and a driving unit comprising a first interface pin and a second interface pin, wherein the first interface pin is connected to the first outer terminal pin of the housing and the second interface pin is connected to the middle terminal pin of the housing, wherein the first controlled terminal of the transistor is connected to the first outer terminal pin and the second controlled terminal of the transistor is connected to the second outer terminal pin, wherein the first outer terminal pin is connected to the first interface pin by a first connection, wherein the middle terminal pin is connected to the second interface pin by a second connection, and the second outer terminal pin is connected to a voltage level by a third connection, and wherein the first connection and the third connection do not cross each other.

2. The power package of claim 1, further comprising:

a second housing comprising a first outer terminal pin, a second outer terminal pin and a middle terminal pin arranged between the first and second outer terminal pins;

a second transistor comprising a first controlled terminal, a second controlled terminal, and a control terminal and housed in the at least one housing, wherein the control terminal of the second transistor is connected to the middle terminal pin of the second housing; and a second driving unit comprising a first interface pin and a second interface pin, wherein the first interface pin of the second driving unit is connected to the first outer terminal pin of the second housing and the second interface pin of the second driving unit is connected to the middle terminal pin of the second housing;

wherein the first controlled terminal of the second transistor is connected to the first outer terminal pin of the second housing and the second controlled terminal of the second transistor is connected to the second outer terminal pin of the second housing, wherein the first outer terminal pin of the housing is connected to the first interface pin of the second driving unit by a fourth connection, wherein the middle terminal pin of the second housing is connected to the second interface pin of the second driving unit by a fifth connection, and the second outer terminal pin of the second housing is connected to a further voltage level by a sixth connection, and wherein the fourth connection and the sixth connection do not cross each other.

3. The power package according to claim 2, wherein the power package forms a half-bridge arrangement.

4. The power package according to claim 3, wherein the power package further comprises a second half-bridge arrangement forming together with the first half-bridge arrangement an H-bridge arrangement.

5. The power package according to claim 3, comprising a plurality of half-bridge arrangements wherein at least two of the plurality of half-bridge arrangements are connected in parallel to each other.

6. The power package of claim 1, further comprising a control unit which is connected to the driving unit and operable to control the driving unit.

7. The power package of claim 6, wherein the control unit comprises a first controlling terminal arranged on a first lateral side of the control unit and a second controlling terminal arranged on a second lateral side of the control unit.

8. The power package of claim 2, further comprising a first diode and a second diode, wherein the first diode is connected between the first controlled terminal and the second controlled terminal of the transistor and the second diode is connected between the first controlled terminal and the second controlled terminal of the second transistor.

9. The power package of claim 1, wherein the housed transistor is selected from the group consisting of a field effect transistor, and a bipolar transistor.

10. The power package according to claim 2, wherein the driving unit and the second driving unit comprise a different sequence of the interface pins.

11. The power package according to claim 1, wherein the first connection is conducted through a first area of the power package and the third connection is conducted through a second area of the power package and the first and second areas are distinct from each other.

12. A method of manufacturing a power package, the method comprising:

providing a transistor comprising a first controlled terminal, a second controlled terminal and a control terminal;

housing the transistor in a housing comprising a first outer terminal pin, a second outer terminal pin and a middle terminal pin, wherein the control terminal is connected to the middle terminal pin and the first controlled terminal is connected to the first outer terminal pin and the second controlled terminal is connected to the second outer terminal pin;

connecting the first outer terminal pin to a driving unit by a first connection and the middle terminal pin to the driving unit by a second connection;

connecting the second outer terminal pin to a voltage level by a third connection;

wherein the first connection and the third connection do not cross each other.

* * * * *